United States Patent
Liu et al.

(10) Patent No.: US 11,601,138 B2
(45) Date of Patent: Mar. 7, 2023

(54) DECODING METHOD OF LDPC CODES BASED ON PARTIAL AVERAGE RESIDUAL BELIEF PROPAGATION

(71) Applicant: Sun Yat-sen University, Guangzhou (CN)

(72) Inventors: Xingcheng Liu, Guangzhou (CN); Shuo Liang, Guangzhou (CN); Shizhan Cheng, Guangzhou (CN)

(73) Assignee: Sun Yat-sen University, Guangzhou (CN)

( * ) Notice: Subject to any disclaimer, the term of this patent is extended or adjusted under 35 U.S.C. 154(b) by 0 days.

(21) Appl. No.: 17/709,554

(22) Filed: Mar. 31, 2022

(65) Prior Publication Data

US 2022/0329262 A1    Oct. 13, 2022

(30) Foreign Application Priority Data

Apr. 1, 2021    (CN) .......................... 202110358266.3

(51) Int. Cl.
*H03M 13/00* (2006.01)
*H03M 13/11* (2006.01)
*H03M 13/39* (2006.01)

(52) U.S. Cl.
CPC ... *H03M 13/1174* (2013.01); *H03M 13/3927* (2013.01); *H03M 13/616* (2013.01); *H03M 13/6513* (2013.01)

(58) Field of Classification Search
CPC ......... H03M 13/1174; H03M 13/3927; H03M 13/616; H03M 13/6513
See application file for complete search history.

(56) References Cited

U.S. PATENT DOCUMENTS

| | | | |
|---|---|---|---|
| 8,504,891 | B2 | 8/2013 | Zhou et al. |
| 9,455,861 | B2 | 9/2016 | Vojcic et al. |
| 10,651,872 | B2 | 5/2020 | Savin et al. |

(Continued)

*Primary Examiner* — Christine T. Tu
(74) *Attorney, Agent, or Firm* — True Shepherd LLC; Andrew C. Cheng

(57) ABSTRACT

A decoding method of low-density parity-check (LDPC) codes based on partial average residual belief propagation includes the following steps: S1: calculating a size of a cluster $\pi$ in a protograph based on a code length m and a code rate of a target codeword; S2: pre-computing an edge residual $r_{c_i \to v_j}$ corresponding to each edge from a variable node to a check node in a check matrix H; S3: calculating, based on $\pi$, a partial average residual (PAR) value corresponding to each cluster in the check matrix H; S4: sorting $m/\pi$ clusters in descending order of corresponding PAR values, and updating an edge with a largest edge residual in each cluster; S5: updating edge information $m_{c_i \to v_j}$ from a check node $c_i$ to a variable node $v_j$, and then updating a log-likelihood ratio (LLR) value $L(v_j)$ of the variable node $v_j$; and S6: after the updating, making a decoding decision.

6 Claims, 6 Drawing Sheets

(56) References Cited

U.S. PATENT DOCUMENTS

| | | | | |
|---|---|---|---|---|
| 10,944,425 B2* | 3/2021 | Usatyuk | ............... | H04L 1/0057 |
| 2005/0283707 A1* | 12/2005 | Sharon | ............... | H03M 13/1137 |
| | | | | 714/758 |
| 2014/0153628 A1* | 6/2014 | Vojcic | ............... | H03M 13/612 |
| | | | | 375/227 |

* cited by examiner

DECODING METHOD OF LDPC CODES BASED ON PARTIAL AVERAGE RESIDUAL BELIEF PROPAGATION

CROSS-REFERENCE TO RELATED APPLICATIONS

This application claims priority to Chinese Patent Application No. 202110358266.3 with a filing date of Apr. 1, 2021. The content of the aforementioned application, including any intervening amendments thereto, is incorporated herein by reference.

TECHNICAL FIELD

The present disclosure relates to the field of communications technologies, and more specifically, to a decoding method of low-density parity-check (LDPC) codes based on partial average residual belief propagation (PARBP).

BACKGROUND ART

Decoding algorithms of LDPC codes are divided into hard decision decoding and soft decision decoding. The hard decision decoding algorithm has the advantages of low decoding complexity and easy hardware implementation, but its error correction performance is far inferior to the soft decision decoding algorithm. The soft decision decoding algorithm can be divided into three categories according to message update policies: parallel scheduling, serial scheduling, and dynamic scheduling. Different from parallel scheduling and serial scheduling that have a fixed update order, dynamic scheduling can dynamically select an appropriate update order based on a current decoding state. Therefore, compared with parallel scheduling and serial scheduling, dynamic scheduling has faster convergence speed and better error correction performance, and is quite suitable for ultra-reliable and low-latency decoding scenarios. A. I. Casado et al. proposed an edge residual—based dynamic scheduling decoding algorithm [A. I. V. Casado, M. Griot and R. D. Wesel. Informed Dynamic Scheduling for Belief-Propagation Decoding of LDPC Codes [C]. *IEEE International Conference on Communications (ICC 2007).* Glasgow, UK. 932-937, June 2007.].

The dynamic scheduling decoding algorithm is a residual belief propagation (RBP) algorithm [A. I. V. Casado, M. Griot and R. D. Wesel. Informed Dynamic Scheduling for Belief-Propagation Decoding of LDPC Codes [C]. *IEEE International Conference on Communications (ICC 2007).* Glasgow, UK. 932-937, June 2007.]. In the RBP algorithm, a message update order is dynamically selected based on check-to-variable (C2V) edge residuals of all edges. For an edge connecting a variable node $v_j$ and a check node $c_i$, its edge residual $r_{c_i \to v_j}$ is calculated according to formula (1):

$$r_{c_i \to v_j} = \|m_{c_i \to v_j}^{pre} - m_{c_i \to v_j}\| \quad (1)$$

In the formula, $m_{c_i \to v_j}$ is current C2V edge information from the check node $c_i$ to the variable node $v_j$, and $m_{c_i \to v_j}^{pre}$ is a pre-computed value of to-be-updated C2V edge information. It can be learned from the calculation formula of the edge residual that a value of the edge residual is always greater than 0. Therefore, an edge with an edge residual of 0 will not be selected. The edge residual is a quantity that describes a difference between a current edge information value and a to-be-updated edge information value. A greater edge residual means a greater difference between the current edge information value and the to-be-updated edge information value, a greater adjustment of an updated edge information value, and a more reliable message update.

Therefore, before each edge information update, the RBP algorithm firstly finds an edge with a largest edge residual from all edges, and then updates its edge information value. After the edge information with the largest edge residual is updated, the residual value is set to 0. Then a decoding decision is made. A message update calculation method of the dynamic scheduling decoding algorithm is consistent with those of the serial scheduling decoding algorithm and the parallel scheduling decoding algorithm.

FIG. 1 shows a message update process of the RBP algorithm. The specific decoding operations are as follows:

Step 1: Calculate edge residuals of all C2V edges in a Tanner graph, and find an edge with a largest edge residual. As shown in FIG. 1(a), assuming that an edge connecting a check node $c_i$ and a variable node $v_j$ has a largest edge residual, update C2V edge information $m_{c_i \to v_j}$ of the edge. After the update is completed, set an edge residual $r(m_{c_i \to v_j})$ to 0.

Step 2: As shown in FIG. 1(b), make a decoding decision on the updated variable node $v_j$, and if the decoding is successful or a maximum number of iterations $Iter_{max}$, is reached, stop the decoding. Otherwise, update a V2C (variable-to-check) message $m_{v_j \to c_a}$ from the variable node $v_j$ to a check node $c_a \in N(v_j) \backslash c_i$.

Step 3: As shown in FIG. 1(c), after the check node $c_a \in N(v_j) \backslash c_i$ obtains the updated information, pre-compute a C2V edge residual from a check node $c_a$ to a variable node $v_b \in N(c_a) \backslash v_j$. Repeat the above decoding process until the decoding is successful or the maximum number of iterations $Iter_{max}$, is reached.

Although the conventional dynamic scheduling decoding algorithm is easy to understand, there are several problems.

1. The dynamic scheduling decoding algorithm performs a global search when an edge with a largest edge residual is selected for updating. As a result, some edges with larger residual values are always updated, while other edges with smaller residual values cannot be selected and updated in the case of global search. Therefore, greediness becomes more obvious as the number of iterations increases. In other words, some variable nodes occupy too many computing resources, such that decoding performance of the decoding algorithm cannot be further improved.

2. Because the LDPC codes have a ring structure of many edges, the dynamic scheduling decoding policy of selecting an update order based on a largest edge residual may cause some rings to fail to be decoded during the update process, thereby forming trap sets. Such trap sets may lead to error floors during the decoding process. Various existing decoding algorithms may generate error floors of different depths.

SUMMARY

In order to resolve the problems of occupying too many computing resources and generating error floors of different depths in the prior art, the present disclosure provides a decoding method of LDPC codes based on PARBP, which occupies fewer computing resources, thereby effectively improving a decoding throughput and lowering an error floor.

To achieve the foregoing objectives, the following technical solutions are used in the present disclosure: A decoding method of LDPC codes based on PARBP is provided. The method includes the following steps:

S1: calculating a size π of a cluster of a base matrix in a protograph based on a code length m and a code rate of a target codeword;

S2: pre-computing an edge residual $r_{c_i \to v_j}$ corresponding to each edge from a variable node to a check node in a check matrix H, where the check matrix H is obtained by lifting the base matrix based on a structural characteristic of the protograph;

S3: calculating, based on π, a partial average residual (PAR) value corresponding to each cluster in the check matrix H;

S4: sorting m/π clusters in descending order of corresponding PAR values, and updating an edge with a largest edge residual in each cluster;

S5: updating edge information $m_{c_i \to v_j}$ from a check node $c_i$ to a variable node $v_j$, and then updating a log-likelihood ratio (LLR) value $L(v_j)$ of the variable node $v_j$; and S6: after the updating, making a decoding decision; and if the decoding decision is successful or a maximum number of iterations is reached, ending the decoding; or if the decoding decision is unsuccessful and the maximum number of iterations is not reached, going to step S2 to continue decoding.

Preferably, a formula for calculating the size of the cluster it in a protograph in step S1 is as follows:

$$\pi = m \div b_v \quad (2)$$

wherein $b_v$ is a number of variable nodes in the base matrix.

Further, a calculation formula of the edge residual $r_{c_i \to v_j}$ is as follows:

$$r_{c_i \to v_j} = \|m_{c_i \to v_j}^{pre} - m_{c_i \to v_j}\| \quad (4)$$

wherein $m_{c_i \to v_j}$ represents the edge information from the check node $c_i$ to the variable node $v_j$, and is expressed as follows:

$$m_{c_i \to v_j} = 2\tanh^{-1}\left\{ \prod_{v_b \in N(c_i)\setminus v_j} \tanh\left(\frac{m_{v_b \to c_i}}{2}\right) \right\} \quad (5)$$

wherein $m_{v_b \to c_i}$ represents a posterior probability LLR value.

Still further, a calculation formula of the PAR value corresponding to each cluster is as follows:

$$\bar{r}_{t_i} = \frac{\sum_{k=0}^{z_0} |r_k|}{z_0} \quad (6)$$

wherein $r_k$ represents a residual value of a k-th edge.

Still further, an expression for updating the LLR value $L(v_j)$ of the variable node $v_j$ is as follows:

$$L(v_j) = \sum_{c_a \in M(v_j)} m_{c_a \to v_j} + C_{v_j} \quad (7)$$

where $C_{v_j}$ represents original channel information of the variable node $v_j$, and $M(v_j)$ represents all check nodes connected to the variable node $v_j$.

Still further, in step S6, specifically, if the decoding decision is unsuccessful and the maximum number of iterations is not reached, edge information from the variable node $v_j$ to a check node $c_a$ is updated according to formula (8):

$$m_{c_a \to v_j} = \sum_{c_a \in M(v_j)\setminus c_a} m_{c_a \to v_j} C_{v_j} \quad (8)$$

wherein $M(v_j)\setminus c_a$ represents all the check nodes connected to the variable node $v_j$ except the check node $c_a$; and edge information is pre-computed for all check nodes $c_a \in M(v_j)\setminus c_i$ according to equation (5), and then an edge residual is calculated according to equation (4) for a next update iteration process.

A computer system is provided, including a memory, a processor, and a computer program stored in the memory and executable on the processor, where the processor implements the steps of the foregoing method when executing the computer program.

A computer-readable storage medium storing a computer program is provided, where the steps of the foregoing method are implemented when the computer program is executed by a processor.

The present disclosure has the following beneficial effects:

Based on structural characteristics of protograph-LDPC (P-LDPC) codes, the present disclosure initially proposes to extend the core of the dynamic scheduling decoding algorithm, that is, a decoding policy of preferentially updating an edge corresponding to a largest edge residual, to be updating a cluster in P-LDPC codes. In addition, the concept of PAR is introduced to describe an update level of each cluster. In this way, a range of spatial search during each iteration process in the soft-decision decoding algorithm can be greatly reduced, thereby improving the decoding throughput. Then an edge with a largest edge residual in each cluster is determined and preferentially updated. This ensures that the edge with the largest edge residual in each cluster can be updated in a determined update order, to minimize generation of silent nodes. This also prevents iterative decoding from falling into possible local optima, to lower error floors.

DETAILED DESCRIPTION OF THE EMBODIMENTS

The present disclosure will be described in further detail below in conjunction with the accompanying drawings and specific embodiments.

Embodiment 1

In this embodiment, a corresponding check matrix can be obtained by lifting a base matrix based on a structural characteristic of a protograph. The following is an example:

$$H = \begin{bmatrix} \pi_{00} & \pi_{01} & 0 & \pi_{03} \\ 0 & \pi_{11} & \pi_{12} & 0 \\ \pi_{20} & 0 & \pi_{22} & 0 \end{bmatrix} \quad (2)$$

wherein $\pi_{ij}$ is a unit permutation matrix or its right-shift matrix, that is, a cluster.

Figure 1:
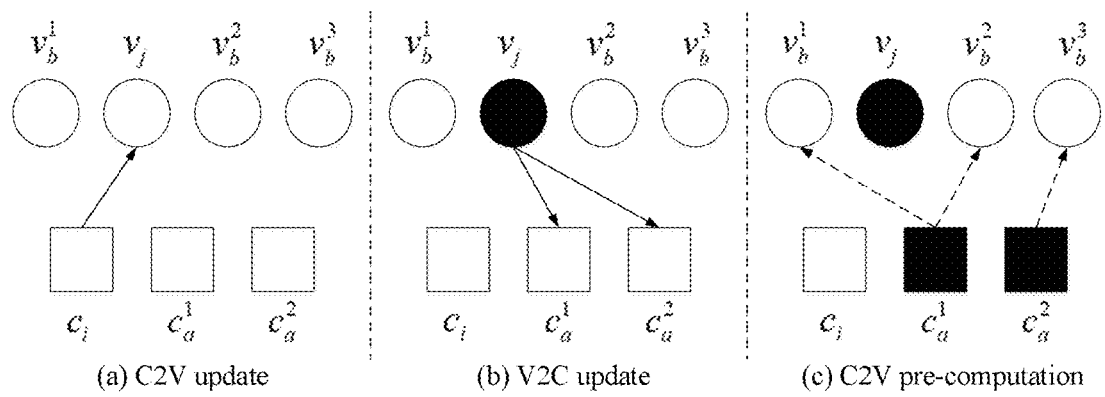
FIG. 1 is a flowchart of a prior-art RBP algorithm.
Figure 2:
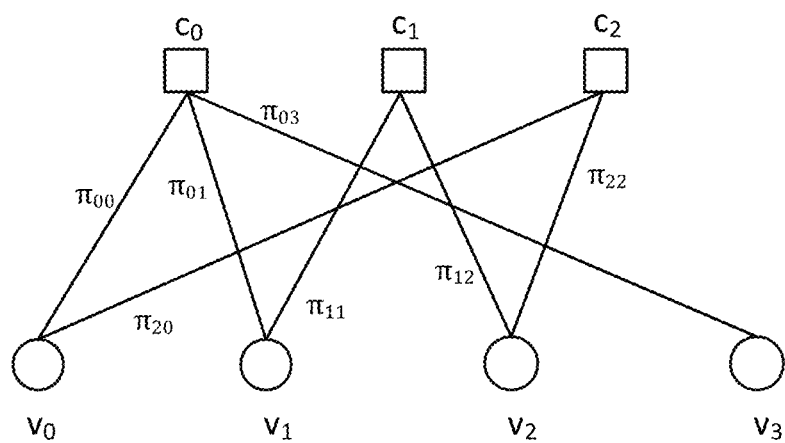
FIG. 2 is a Tanner graph after expansion of a protograph in Embodiment 1.

FIG. 2 shows a Tanner graph after expansion of the protograph in the above example, where $v_i$ is a variable node of the base matrix, and $c_j$ is a check node of the base matrix.

Figure 3:
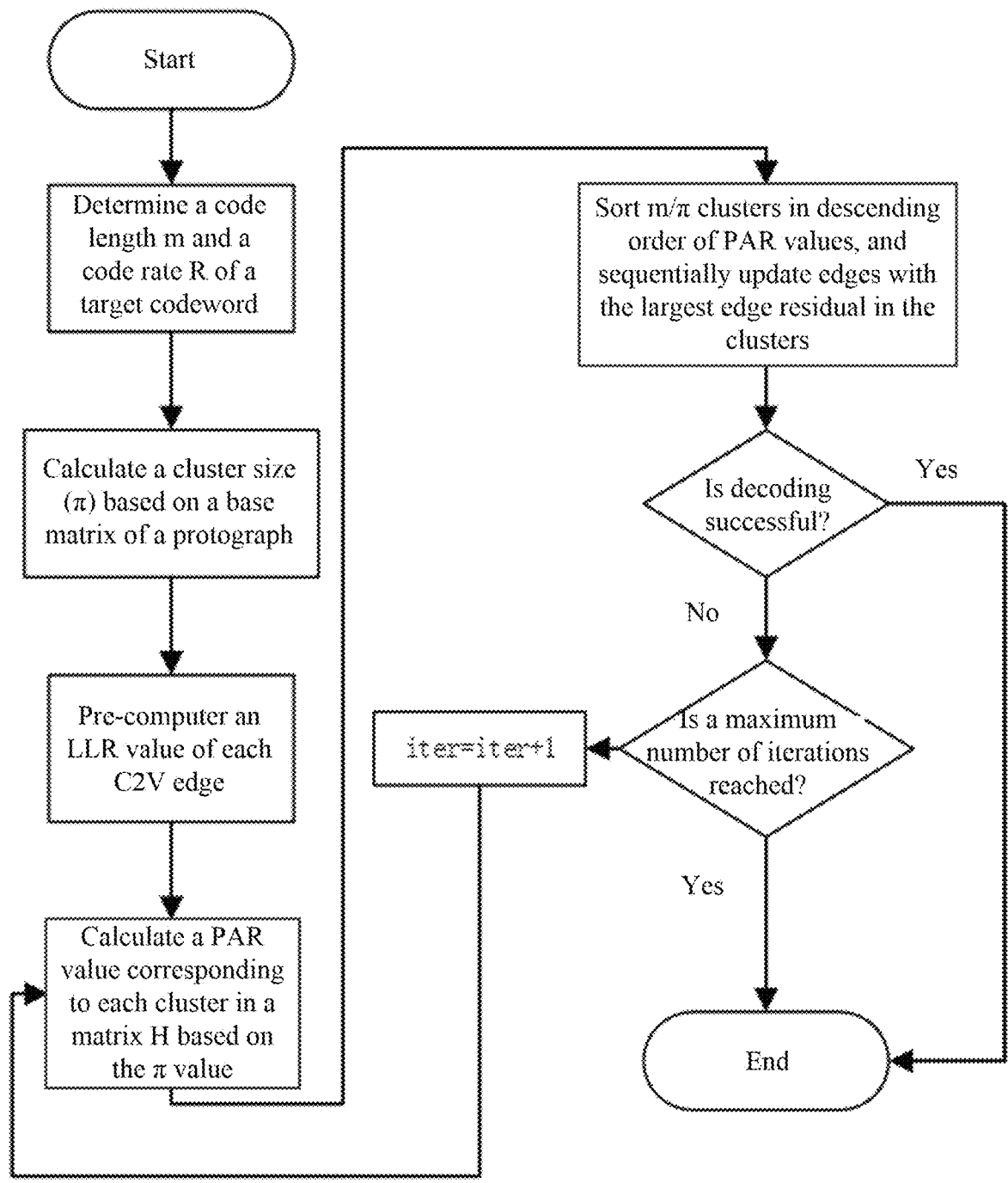
FIG. 3 is a flowchart of a method according to Embodiment 1.

Combined with the Tanner graph structural characteristics of the base matrix shown in FIG. 2, this embodiment provides a decoding method of LDPC codes based on partial average residual belief propagation (PARBP). As shown in FIG. 3, the method includes the following steps.

S1: Calculate a size of a cluster π in a protograph based on a code length m and a code rate of a target codeword. A calculation formula is as follows:

$$\pi = m \div b_v \quad (2)$$

wherein $b_v$ is a number of variable nodes in the base matrix.

S2: Pre-compute an edge residual $r_{c_i \to v_j}$ corresponding to each edge from a variable node to a check node in a check matrix H.

A calculation formula of the edge residual $r_{c_i \to v_j}$ is as follows:

$$r_{c_i \to v_j} = \|m_{c_i \to v_j}^{pre} - m_{c_i \to v_j}\| \quad (4)$$

wherein $m_{c_i \to v_j}$ represents edge information from a check node $c_i$ to a variable node $v_j$, and is expressed as follows:

$$m_{c_i \to v_j} = 2\tanh^{-1}\left\{\prod_{v_b \in N(c_i)\backslash v_j} \tanh\left(\frac{m_{v_b \to c_i}}{2}\right)\right\} \quad (5)$$

wherein $m_{v_b \to c_i}$ represents a posterior probability LLR value.

S3: Calculate, based on π, a PAR value corresponding to each cluster in the check matrix H.

A formula for calculating the PAR value corresponding to each cluster is as follows:

$$\bar{r}_{||} = \frac{\sum_{k=0}^{z_0} |r_k|}{z_0} \quad (6)$$

wherein $r_k$ represents a residual value of a k-th edge.

S4: Sort m/π clusters in descending order of corresponding PAR values, and update an edge with a largest edge residual in each cluster according to formula (5).

S5: Update the edge information $m_{c_i \to v_j}$ from the check node $c_i$ to the variable node $v_j$, and then update an LLR value $L(v_j)$ of the variable node $v_j$.

An expression for updating the LLR value $L(v_j)$ of the variable node $v_j$ is as follows:

$$L(v_j) = \Sigma_{c_a \in M(v_j)} m_{c_a \to v_j} + C_{v_j} \quad (7)$$

wherein $C_{v_j}$ represents original channel information of the variable node $v_j$, and $M(v_j)$ represents all check nodes connected to the variable node $v_j$.

S6: After the updating, making a decoding decision; and if the decoding decision is successful or a maximum number of iterations is reached, end the decoding; or if the decoding decision is unsuccessful and the maximum number of iterations is not reached, go to step S2 to continue decoding.

Specifically, if the decoding decision is unsuccessful and the maximum number of iterations is not reached, edge information from the variable node $v_j$ to a check node $c_a$ is updated according to formula (8):

$$m_{c_a \to v_j} = \Sigma_{c_a \in M(v_j)\backslash c_a} m_{c_a \to v_j} + C_{v_j} \quad (8)$$

wherein $M(v_j)\backslash c_a$ represents all the check nodes connected to the variable node $v_j$ except the check node $c_a$.

Edge information is pre-computed for all check nodes $c_a \in M(v_j)\backslash c_i$ according to equation (5), and then an edge residual is calculated according to equation (4) for a next update iteration process.

Compared with the conventional dynamic scheduling decoding algorithm, the method in this embodiment gives greater consideration to the structural characteristics of codewords. For single edge protograph LDPC codes, a degree distribution and ring structure of the check matrix H largely depend on a corresponding base matrix. In the base matrix, each cluster definitely has no ring structure. An update order is measured by using a cluster residual, and an edge with a largest edge residual is found in the cluster and updated, so as to ensure that each update can achieve highly reliable information and a largest amount of information, and minimize a range of finding the edges with the largest edge residual. In this way, the computing speed can be increased locally and the spatial complexity can be reduced, thereby greatly improving the convergence speed and avoiding the greediness in global decoding to the greatest extent.

To better illustrate the advantages of the decoding method of LDPC codes proposed in this embodiment, performance comparison is performed between this method and the current mainstream dynamic scheduling decoding algorithms. To ensure performance comparison fairness, all simulations were performed under the same hardware configurations. A computer used for the simulation employs Intel® Core™ CPU i7-8700, a clock speed of 3.20 GHz, a memory of 16.0 GB, and a Windows 10 64-bit operating system. Specifically, randomly generated LDPC codes are transmitted on an additive white Gaussian noise (AWGN) channel, and a variety of different decoding algorithms including the algorithm in this embodiment are used for decoding, where the maximum number of iterations is set to 5, the maximum number of error frames is set to 100, a modulation coding scheme is set to binary phase shift keying (BPSK), and $E_b/N_0$ represents a normalized signal-to-noise ratio in decibels (dB).

Figure 4:
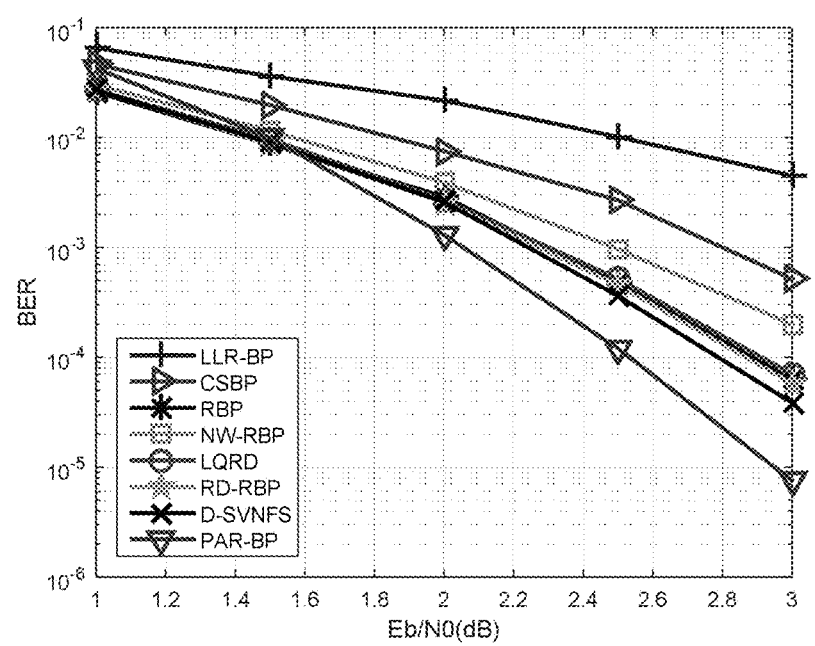
FIG. 4 is a comparison diagram of bit error rates (BERs) of different decoding algorithms for LDPC codes on a fading channel.
Figure 5:
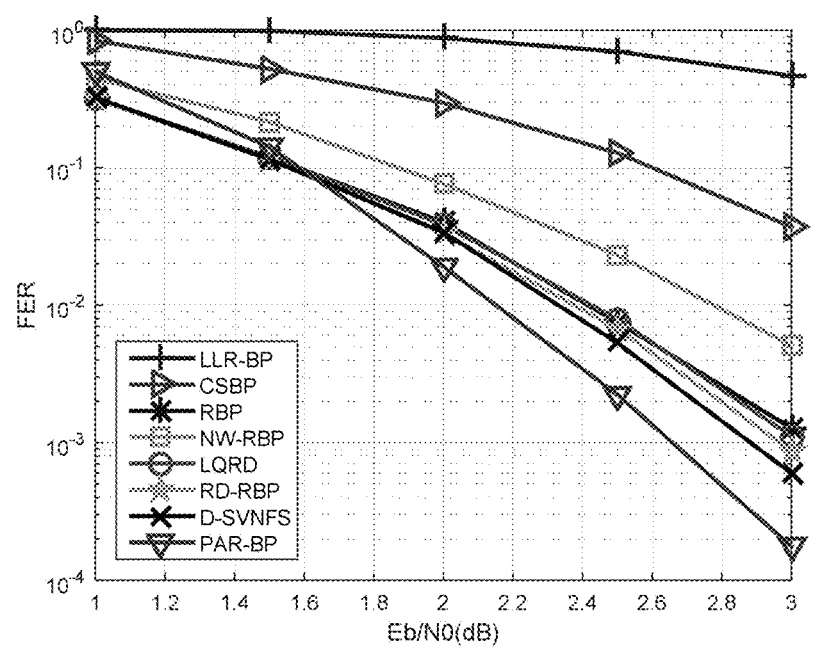
FIG. 5 is a comparison diagram of frame error rate (FER) performance of different decoding algorithms for LDPC codes on a fading channel.

FIG. 4 and FIG. 5 are comparison diagrams of BERs and FER performance of different decoding algorithms for (576, 288) LDPC codes on a fading channel. In the figures, at a low signal-to-noise ratio, for example, from 1.0 dB to 1.6 dB, error correction performance curves of different dynamic scheduling decoding algorithms almost overlap, meaning that the error correction performance of different algorithms has little difference. However, the error correction performance of the algorithms changes significantly at a signal-to-noise ratio above 1.6 dB. At 1.6 dB or below, performance curves of a residual-decaying-based RBP (RD-RBP) algorithm, a Lazy Queue Residual Decoding (LQRD) algorithm, and a dynamic silent-variable-node-free scheduling (D-SVNFS) algorithm almost overlap, but their performance declines much faster than other algorithms. Starting from 1.8 dB, as the signal-to-noise ratio increases, the PARBP algorithm gradually shows its advantages over the RD-RBP algorithm, the D-SVNFS algorithm, and the LQRD algorithm, and becomes the algorithm with the optimal decoding performance. When the BER is $1.0\times10^{-4}$, compared with the suboptimal D-SVNFS algorithm, the PARBP algorithm in this embodiment increases the performance by about 0.28 dB. When the BER is $1.0\times10^{-3}$, compared with the suboptimal D-SVNFS algorithm, the PARBP algorithm in this embodiment increases the performance by about 0.22 dB.

Figure 6:
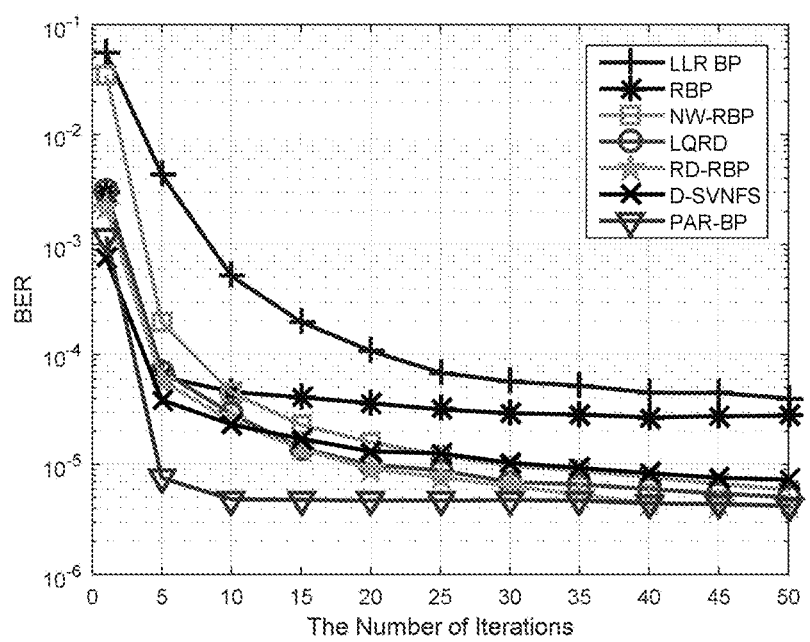
FIG. 6 is a comparison diagram of convergence performance of different decoding algorithms for LDPC codes at a fixed signal-to-noise ratio of 3.0 dB as the number of iterations increases.

FIG. 6 is a comparison diagram of convergence performance of different decoding algorithms for (576, 288) LDPC codes at a fixed signal-to-noise ratio of 3.0 dB as the number of iterations increases. As shown in FIG. 5, the PARBP algorithm in this embodiment has a good convergence performance. Compared with other decoding algorithms, the PARBP algorithm achieves a nearly converged BER after the 5-th iteration. During the 5-th to 20-th iteration, the BER performance of other decoding algorithms are still converging, while the BER performance of the PARBP algorithm in this embodiment has converged as early as before the 10-th iteration. During the 5-th to 50-th iteration, the BER performance of the PARBP algorithm in this embodiment is significantly better than the BER performance of other algorithms, meaning that the PARBP algorithm in this embodiment has better convergence performance than other algorithms, especially in the speed of convergence.

Embodiment 2

A computer system is provided, including a memory, a processor, and a computer program stored in the memory and executable on the processor, where the processor implements the following method steps when executing the computer program:

S1: calculating the size $\pi$ of a cluster of a base matrix in a protograph based on a code length m and a code rate of a target codeword:

S2: pre-computing an edge residual $r_{c_i \to v_j}$ corresponding to each edge from a variable node to a check node in a check matrix H, where the check matrix H is obtained by lifting the base matrix based on a structural characteristic of the protograph;

S3: calculating, based on $\pi$, a PAR value corresponding to each cluster in the check matrix H;

S4: sorting m/$\pi$ clusters in descending order of corresponding PAR values, and updating an edge with a largest edge residual in each cluster;

S5: updating edge information $m_{c_i \to v_j}$ from a check node $c_i$ to a variable node $v_j$, and then updating an LLR value $L(v_j)$ of the variable node $v_j$; and S6: after the updating, making a decoding decision; and if the decoding decision is successful or a maximum number of iterations is reached, ending the decoding; or if the decoding decision is unsuccessful and the maximum number of iterations is not reached, going to step S2 to continue decoding.

Embodiment 3

A computer-readable storage medium storing a computer program is provided, where the following method steps are implemented when the computer program is executed by a processor:

S1: calculating the size $\pi$ of a cluster of a base matrix in a protograph based on a code length m and a code rate of a target codeword:

S2: pre-computing an edge residual $r_{c_i \to v_j}$ corresponding to each edge from a variable node to a check node in a check matrix H, where the check matrix H is obtained by lifting the base matrix based on a structural characteristic of the protograph;

S3: calculating, based on $\pi$, a PAR value corresponding to each cluster in the check matrix H;

S4: sorting m/$\pi$ clusters in descending order of corresponding PAR values, and updating an edge with a largest edge residual in each cluster;

S5: updating edge information $m_{c_i \to v_j}$ from a check node $c_i$ to a variable node $v_j$, and then updating an LLR value $L(v_j)$ of the variable node $v_j$; and S6: after the updating, making a decoding decision; and if the decoding decision is successful or a maximum number of iterations is reached, ending the decoding; or if the decoding decision is unsuccessful and the maximum number of iterations is not reached, going to step S2 to continue decoding.

It is apparent that the above embodiments are merely intended to describe the present disclosure clearly, rather than to limit the implementations of the present disclosure. Any modification, equivalent substitution and improvement made within the spirit and principle of the present disclosure should fall within the protection scope of the claims of the present disclosure.

What is claimed is:

1. A decoding method of low-density parity-check (LDPC) codes based on partial average residual belief propagation (PARBP) executed in a computer system, the computer system comprising a memory, a processor, and a computer program stored in the memory and executable on the processor, wherein the processor is operable to execute the computer program so as to implement the decoding method of LDPC codes based on PARBP, wherein the decoding method comprises the following steps:

S1: calculating a cluster size $\pi$ of a base matrix in a protograph based on a code length m and a code rate of a target codeword;

S2: pre-computing an edge residual $r_{c_i \to v_j}$ corresponding to each edge from a variable node to a check node in a check matrix H, wherein the check matrix H is obtained by lifting the base matrix based on a structural characteristic of the protograph;

S3: calculating, based on $\pi$, a partial average residual (PAR) value corresponding to each cluster of m/$\pi$ clusters in the check matrix H;

S4: sorting the m/$\pi$ clusters in descending order of corresponding PAR values, and updating an edge with a largest edge residual in each cluster of the m/$\pi$ clusters;

S5: updating edge information $m_{c_i \to v_j}$ from a check node $c_i$ to a variable node $v_j$, and then updating a log-likelihood ratio (LLR) value $L(v_j)$ of the variable node $v_j$; and S6: after the updating, making a decoding decision; and if the decoding decision is successful or a maximum number of iterations is reached, ending the decoding; or if the decoding decision is unsuccessful and the maximum number of iterations is not reached, going to step S2 to continue decoding;

wherein a formula for calculating the cluster size $\pi$ in the protograph in step S1 is as follows:

$$\pi = m \div b_v$$

wherein $b_v$ is a number of variable nodes in the base matrix and m denotes the code length.

2. The decoding method according to claim 1, wherein a calculation formula of the edge residual $r_{c_i \to v_j}$ is as a $r_{c_i \to v_j}$ equation listed below:

$$r_{c_i \to v_j} = \|m_{c_i \to v_j}^{pre} - m_{c_i \to v_j}\|$$

wherein $m_{c_i \to v_j}$ represents the edge information from the check node $c_i$ to the variable node $v_j$, and is expressed as a $m_{c_i \to v_j}$ equation listed below:

$$m_{c_i \to v_j} = 2\tanh^{-1}\left\{\prod_{v_b \in N(c_i)\backslash v_j} \tanh\left(\frac{m_{v_b \to c_i}}{2}\right)\right\}$$

wherein $m_{v_b \to c_i}$ represents a posterior probability LLR value.

3. The decoding method according to claim 2, wherein a formula for calculating the PAR value corresponding to each cluster is as follows:

$$\bar{r}_{ij} = \frac{\sum_{k=0}^{z_0} |r_k|}{z_0}$$

wherein $r_k$ represents a residual value of a k-th edge.

4. The decoding method according to claim 3, wherein an expression for updating the LLR value $L(v_j)$ of the variable node $v_j$ is as follows:

$$L(v_j) = \Sigma_{c_a \in M(v_j)} m_{c_a \to v_j} + C_{v_j}$$

wherein $c_{v_j}$ represents original channel information of the variable node $v_j$, and $M(v_j)$ represents all check nodes connected to the variable node v.

5. The decoding method according to claim 4, wherein in step S6, specifically, if the decoding decision is unsuccessful and the maximum number of iterations is not reached, edge information from the variable node $v_j$ to a check node $c_a$ is updated according to the following formula:

$$m_{c_a \to v_j} = \Sigma_{c_a \in M(v_j)\backslash c_a} m_{c_a \to v_j} C_{v_j}$$

wherein $M(v_j)\backslash c_a$ represents all the check nodes connected to the variable node $v_j$ except the check node $c_a$; and
edge information is pre-computed for all check nodes $c_a \in M(v_j)\backslash c_i$ according to the $m_{c_i \to v_i}$ equation, and then an edge residual is calculated according to the $r_{c_i \to v_i}$ equation for a next update iteration process.

6. A non-transitory computer-readable storage medium storing a computer program, wherein when the computer program is executed by a processor, the steps of the decoding method according to claim 1 are implemented.

* * * * *